United States Patent
Li (10) Patent No.: US 8,454,749 B2
(45) Date of Patent: Jun. 4, 2013

(54) METHOD AND SYSTEM FOR SEALING A FIRST ASSEMBLY TO A SECOND ASSEMBLY OF A PROCESSING SYSTEM

(75) Inventor: Yicheng Li, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 686 days.

(21) Appl. No.: 11/305,036

(22) Filed: Dec. 19, 2005

(65) Prior Publication Data

US 2007/0157683 A1 Jul. 12, 2007

(51) Int. Cl.
*C23C 16/06* (2006.01)

(52) U.S. Cl.
USPC .......................... 118/715; 70/209

(58) Field of Classification Search
USPC .......................... 118/715; 70/209
See application file for complete search history.

(56) References Cited

U.S. PATENT DOCUMENTS

| | | | | |
|---|---|---|---|---|
| 3,672,207 A * | 6/1972 | Cramp et al. | .................. | 73/40.7 |
| 5,048,800 A * | 9/1991 | Miyazaki et al. | ............. | 266/256 |
| 5,133,561 A * | 7/1992 | Hattori et al. | ................. | 277/646 |
| 5,359,148 A * | 10/1994 | Okase et al. | ................... | 118/724 |
| 5,578,132 A * | 11/1996 | Yamaga et al. | ............... | 118/724 |
| 5,997,649 A * | 12/1999 | Hillman | ........................ | 118/715 |
| 6,287,435 B1 * | 9/2001 | Drewery et al. | ......... | 204/298.09 |
| 6,358,324 B1 * | 3/2002 | Hongoh et al. | ............... | 118/728 |
| 6,527,865 B1 * | 3/2003 | Sajoto et al. | .................. | 118/715 |
| 6,558,508 B1 * | 5/2003 | Kawakami | ............... | 156/345.51 |
| 6,663,713 B1 * | 12/2003 | Robles et al. | ................. | 118/719 |
| 6,736,930 B1 * | 5/2004 | Hongoh | .................... | 156/345.41 |
| 6,800,173 B2 * | 10/2004 | Chiang et al. | ............ | 156/345.33 |
| 6,825,615 B2 * | 11/2004 | Shigeoka | ...................... | 313/635 |
| 6,903,030 B2 * | 6/2005 | Ishii et al. | ..................... | 438/782 |
| 7,304,002 B2 * | 12/2007 | Nishita et al. | ................. | 438/758 |
| 7,365,403 B1 * | 4/2008 | Ramkumar | .................... | 257/410 |
| 2001/0003271 A1 * | 6/2001 | Otsuki | ........................ | 118/723 I |
| 2002/0168854 A1 * | 11/2002 | Tometsuka | .................... | 438/680 |
| 2003/0035705 A1 * | 2/2003 | Johnson | ........................ | 414/217 |
| 2003/0197844 A1 * | 10/2003 | Mertens | ......................... | 355/53 |
| 2004/0038487 A1 * | 2/2004 | Olsen | ........................... | 438/287 |
| 2004/0042152 A1 * | 3/2004 | Ishizaka et al. | ............... | 361/234 |
| 2004/0221808 A1 * | 11/2004 | Kawano | ......................... | 118/715 |
| 2004/0231585 A1 * | 11/2004 | Yamasaki et al. | ............. | 118/715 |
| 2005/0022737 A1 * | 2/2005 | Shimizu et al. | .............. | 118/715 |
| 2005/0051100 A1 * | 3/2005 | Chiang et al. | ................. | 118/728 |
| 2005/0070128 A1 * | 3/2005 | Xia et al. | ........................ | 438/789 |
| 2005/0098111 A1 * | 5/2005 | Shimizu et al. | ............... | 118/715 |
| 2005/0217799 A1 * | 10/2005 | O'Meara et al. | ......... | 156/345.52 |

* cited by examiner

*Primary Examiner* — Jeffrie R Lund
*Assistant Examiner* — Satish Chandra
(74) *Attorney, Agent, or Firm* — Oblon, Spivak, McClelland, Maier & Neustadt, L.L.P.

(57) ABSTRACT

A method, computer readable medium, and system for vapor deposition on a substrate that maintain a first assembly of the vapor deposition system at a first temperature, maintain a second assembly of the vapor deposition system at a reduced temperature lower than the first temperature, dispose the substrate in a process space of the first assembly that is vacuum isolated from a transfer space in the second assembly, and deposit a material on the substrate. As such, the system includes a first assembly having a process space configured to facilitate material deposition, a second assembly coupled to the first assembly and having a transfer space to facilitate transfer of the substrate into and out of the deposition system, a substrate stage connected to the second assembly and configured to support the substrate, and a sealing assembly configured to separate the process space from the transfer space. The first assembly is configured to be maintained at a first temperature and the second assembly is configured to be maintained at a reduced temperature lower than the first temperature.

26 Claims, 7 Drawing Sheets

METHOD AND SYSTEM FOR SEALING A FIRST ASSEMBLY TO A SECOND ASSEMBLY OF A PROCESSING SYSTEM

CROSS REFERENCE TO RELATED APPLICATIONS

This application is related to U.S. Ser. No. 11/090,255, entitled "A PLASMA ENHANCED ATOMIC LAYER DEPOSITION SYSTEM", now U.S. Pat. Appl. Publ. No. 2006-0213437, the entire contents of which are incorporated herein by reference. This application is related to U.S. Ser. No. 11/084,176, entitled "A DEPOSITION SYSTEM AND METHOD", now U.S. Pat. Appl. Publ. No. 2006-0211243, the entire contents of which are incorporated herein by reference. This application is related to U.S. Ser. No. 11/090,939, entitled "A PLASMA ENHANCED ATOMIC LAYER DEPOSITION SYSTEM HAVING REDUCED CONTAMINATION", now U.S. Pat. Appl. Publ. No. 2006-0213439, the entire contents of which are incorporated herein by reference. This application is related to U.S. Ser. No. 11/281,343, entitled "METHOD AND SYSTEM FOR PERFORMING DIFFERENT DEPOSITION PROCESSES WITHIN A SINGLE CHAMBER", now U.S. Pat. Appl. Publ. No. 2007-0116888, the entire contents of which are incorporated herein by reference. This application is related to U.S. Ser. No. 11/281,342, entitled "METHOD AND SYSTEM FOR PERFORMING PLASMA ENHANCED ATOMIC LAYER DEPOSITION", now U.S. Pat. Appl. Publ. No. 2007-0116887, the entire contents of which are incorporated herein by reference. This application is related to U.S. Ser. No. 11/281,376, entitled "APPARATUS FOR THERMAL AND PLASMA ENHANCED VAPOR DEPOSITION AND METHOD OF OPERATING", now U.S. Pat. Appl. Publ. No. 2007-0116873, the entire contents of which are incorporated herein by reference.

BACKGROUND OF THE INVENTION

1. Field of the Invention

The present invention relates to a deposition system and a method of operating thereof, and more particularly to a deposition system having separate regions for material deposition and transfer.

2. Description of Related Art

Typically, during materials processing, when fabricating composite material structures, a plasma is frequently employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, a plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), and plasma enhanced ALD (PEALD) has emerged as a candidate for ultra-thin gate film formation in front end-of-line (FEOL) operations, as well as ultra-thin barrier layer and seed layer formation for metallization in back end-of-line (BEOL) operations. In ALD, two or more process gases, such as a film precursor and a reduction gas, are introduced alternatingly and sequentially while the substrate is heated in order to form a material film one monolayer at a time. In PEALD, plasma is formed during the introduction of the reduction gas to form a reduction plasma. To date, ALD and PEALD processes have proven to provide improved uniformity in layer thickness and conformality to features on which the layer is deposited, albeit these processes are slower than their CVD and PECVD counterparts.

SUMMARY OF THE INVENTION

One object of the present invention is directed to addressing various problems with semiconductor processing at ever decreasing line sizes where conformality, adhesion, and purity are becoming increasingly important issues affecting the resultant semiconductor device.

Another object of the present invention is to reduce contamination problems between interfaces of subsequently deposited or processed layers.

Another object of the present invention is to provide a configuration compatible for vapor deposition and sample transfer within the same system.

Variations of these and/or other objects of the present invention are provided by certain embodiments of the present invention.

In one embodiment of the present invention, a sealing device configured to provide a seal in a processing system between a first assembly of the processing system and a second assembly of the processing system is provided. The sealing device includes a first seal located between a first surface of the first assembly and a second surface of the second assembly at a first location proximate an interior of the processing system. The sealing device includes a second seal located between the first assembly and the second assembly at a second location proximate the first location. The sealing device includes a third seal located between the first assembly and the second assembly at a third location proximate the second location. A first channel in the second assembly connects to a first interface region disposed between the first seal and the second seal, and is configured to couple the first interface region to a vacuum source or a purge gas supply. A second channel in the second assembly connects to a second interface region disposed between the second seal and the third seal, and is configured to couple the second interface region to the vacuum source or the purge gas supply.

In another embodiment of the present invention, a method is provided for sealing a first assembly of a processing system to a second assembly of the processing system. The method evacuates a first interface region proximate an interior of the processing system and located between the first assembly and the second assembly. The method evacuates a second interface region proximate the first interface region and located between the first assembly and the second assembly. The method fills the second interface region with a purge gas.

BRIEF DESCRIPTION OF THE DRAWINGS

In the accompanying drawings, a more complete appreciation of the present invention and many attendant advantages thereof will be readily obtained as the same becomes better understood by reference to the following detailed description when considered in connection with the accompanying drawings, wherein.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1A:
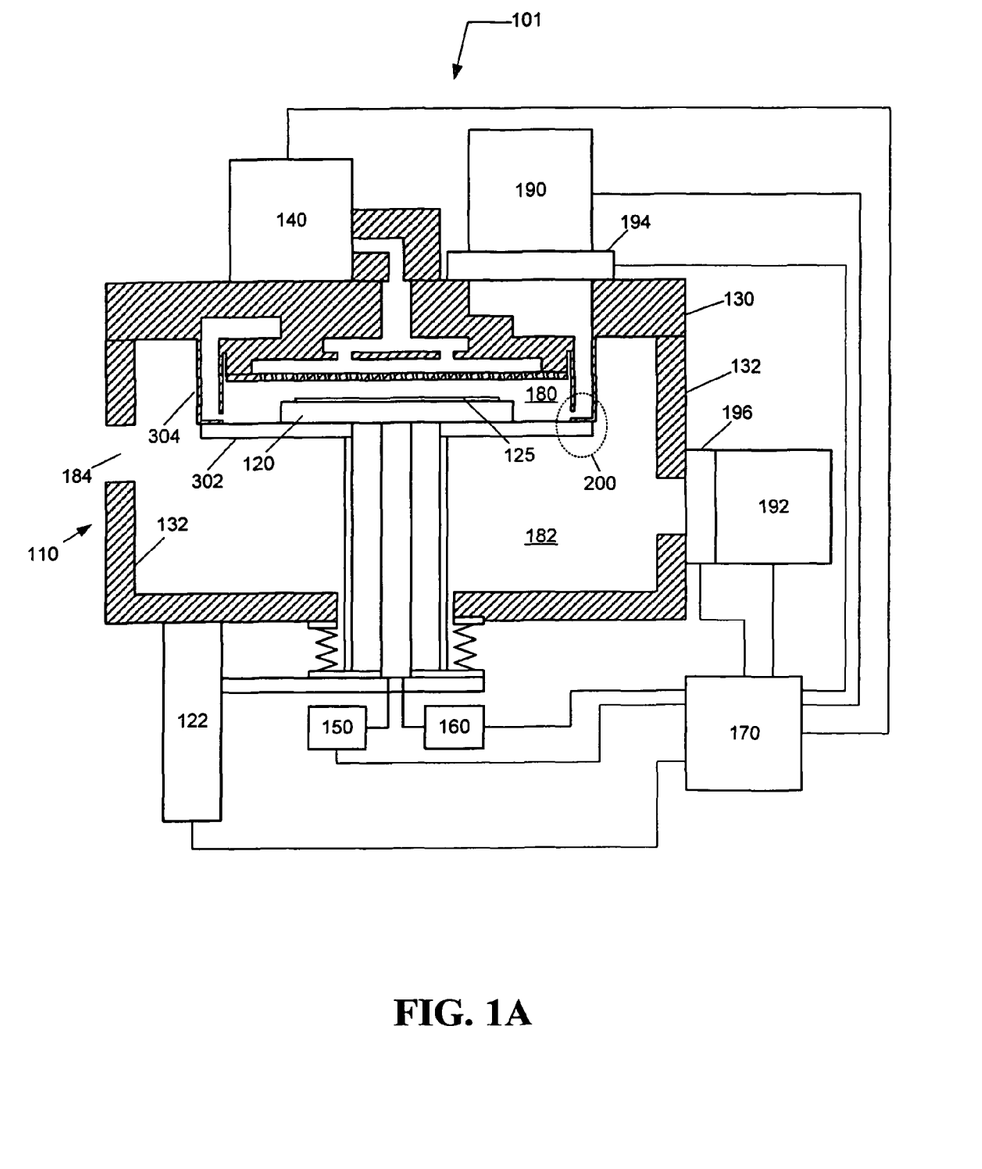
FIGS. 1A and 1B depict schematic views of a deposition system in accordance with embodiments of the present invention.

Referring now to the drawings, wherein like reference numerals designate identical or corresponding parts throughout the several views, FIG. 1A illustrates a deposition system 101 for depositing a thin film, such as for example a barrier film, on a substrate using for example a plasma enhanced atomic layer deposition (PEALD) process. During the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, a thin conformal seed layer may be deposited on wiring trenches or vias to provide a film with acceptable adhesion properties for bulk metal fill, and/or a thin conformal adhesion layer may be deposited on wiring trenches or vias to provide a film with acceptable adhesion properties for metal seed deposition. In addition to these processes, a bulk metal such as copper must be deposited within the wiring trench or via.

As line sizes shrink, PEALD has emerged as a leading candidate for such thin films. For example, a thin barrier layer is preferably performed using a self-limiting ALD process, such as PEALD, since it provides acceptable conformality to complex, high aspect ratio features. In order to achieve a self-limiting deposition characteristic, a PEALD process involves alternating different process gases, such as a film precursor and a reduction gas, whereby the film precursor is adsorbed to the substrate surface in a first step and then reduced to form the desired film in a second step. Due to the alternation of two process gases in a vacuum chamber, deposition occurs at a relatively slow deposition rate.

The present inventors have recognized that the first (non-plasma) step, i.e., film precursor adsorption, in a PEALD process can benefit from a small process space volume to increase throughput and/or preserve process gas while a larger process space volume is required to sustain a uniform plasma during the second (plasma assisted reduction) step in the PEALD process.

Thus, it is described in related applications "METHOD AND SYSTEM FOR PERFORMING THERMAL AND PLASMA ENHANCED VAPOR DEPOSITION" and "A DEPOSITION SYSTEM AND METHOD FOR PLASMA ENHANCED ATOMIC LAYER DEPOSITION" to vary the size of a process space to accommodate different processes or steps.

Additionally, the present invention also desirably separates the process space within which the PEALD process is performed from a transfer space within which the substrate is transferred into and out of the processing chamber. The physical isolation of the process space and the transfer space reduces the contamination of processed substrates. Since CVD and ALD processes are known to be "dirtier" than other deposition techniques, such as physical vapor deposition (PVD), the physical isolation of the process space and the transfer space can further reduce the transport of contamination from the processing chamber to other processing chambers coupled to the central transfer system. Thus, one aspect of the present invention provides and maintains isolation of the process space from the transfer space. Thus, another aspect of the present invention provides and maintains isolation of the process space from the transfer space while varying the size of the process space.

Further, the materials used for the CVD and ALD processes are increasingly more complex. For example, when depositing metal containing films, metal halide film precursors or metal-organic film precursors are utilized. As such, the processing chambers are often contaminated with precursor residue or partially decomposed precursor residue or both on walls of the deposition system. As a result, vacuum buffer chambers have been employed to isolate the deposition system from in vacuo transfer systems that transport the process wafer to other processing chambers. The buffer chambers, however, add more cost and time to the overall fabrication process.

One way to reduce film precursor residue on chamber surfaces is to increase a temperature of the surfaces in the processing chambers to a point where precursor accumulation cannot occur. However, the present inventors have recognized that such a high temperature chamber (especially when used with elastomer seals) can cause air and water vapor from outside of the (vacuum) processing chamber, and therefore contaminants, to permeate through the seals of the processing chamber. For example, while maintaining one chamber component at an elevated temperature with another chamber component at a lower temperature, the inventors have observed an increase in processing chamber contamination from outside of the chamber when the sealing member comprises elastomer seals used with conventional sealing schemes.

Hence, another aspect of the present invention is to physically separate the process space from the transfer space of the processing chamber during processing, and thereby maintain the process space surfaces at a relatively high temperature to reduce film precursor accumulation, while maintaining transfer space surfaces at a lower temperature to reduce contamination within the transfer space region.

Figure 1B:
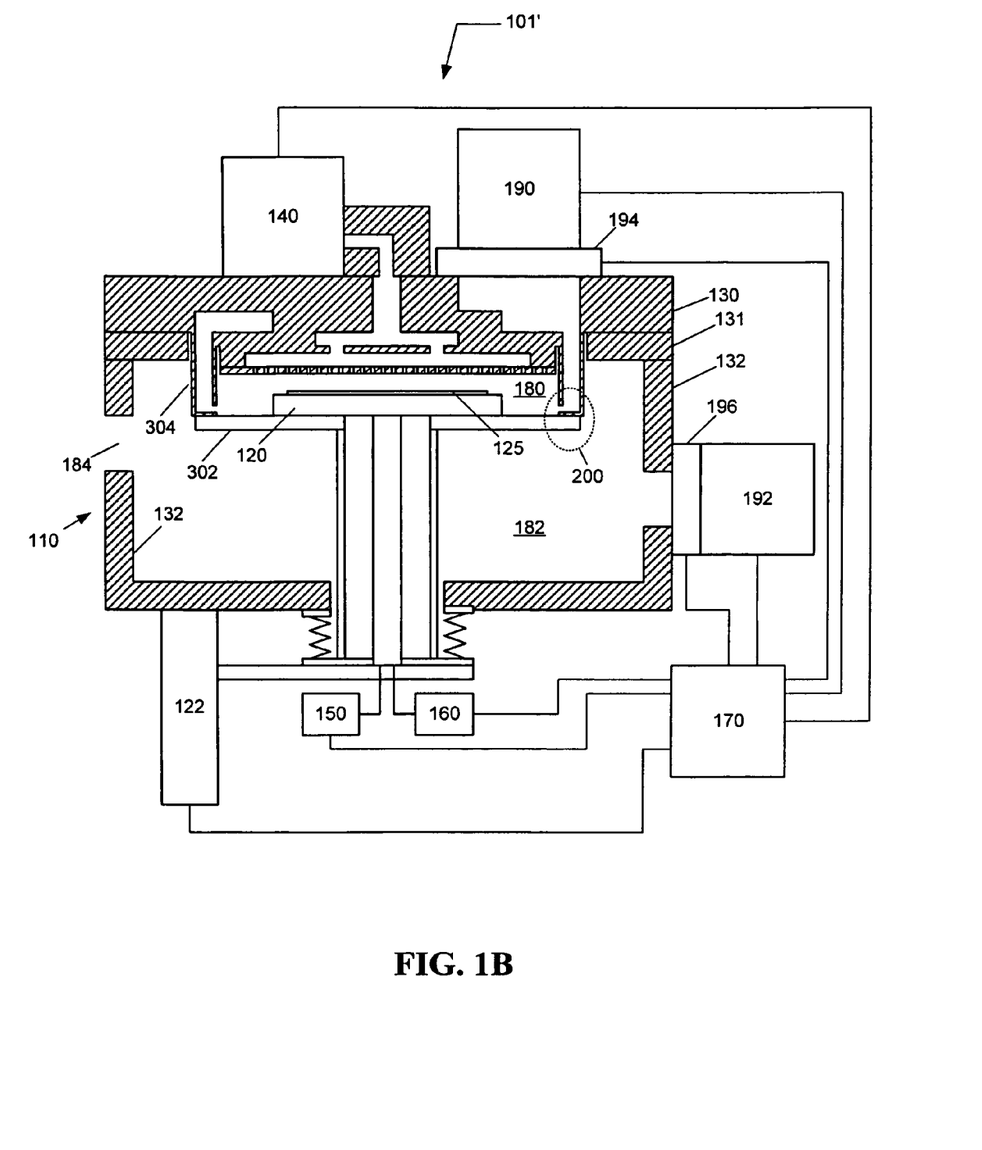
Figure 2A:
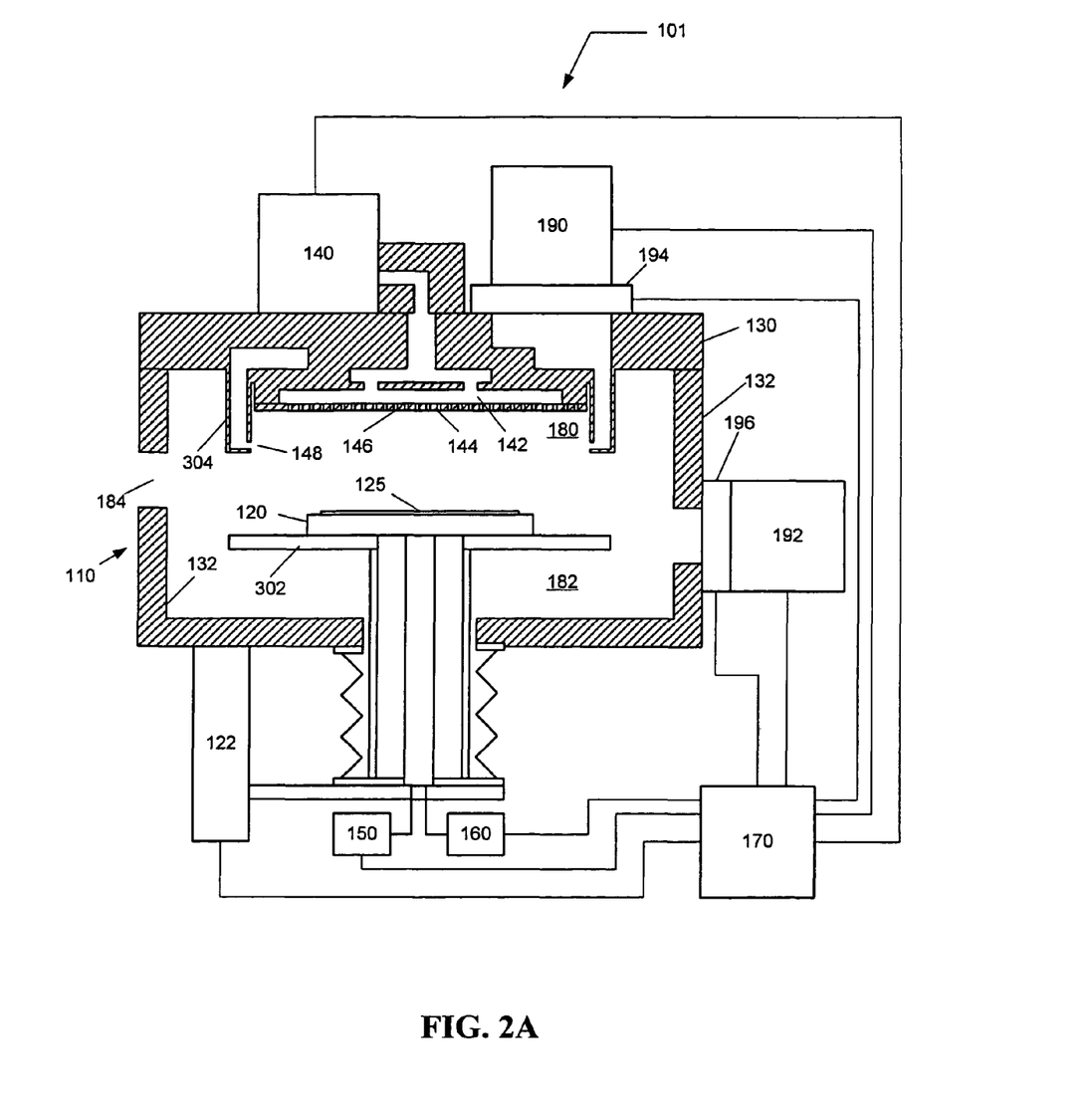
FIGS. 2A and 2B depict additional schematic views of the deposition system in accordance with embodiments of the present invention.
Figure 2B:
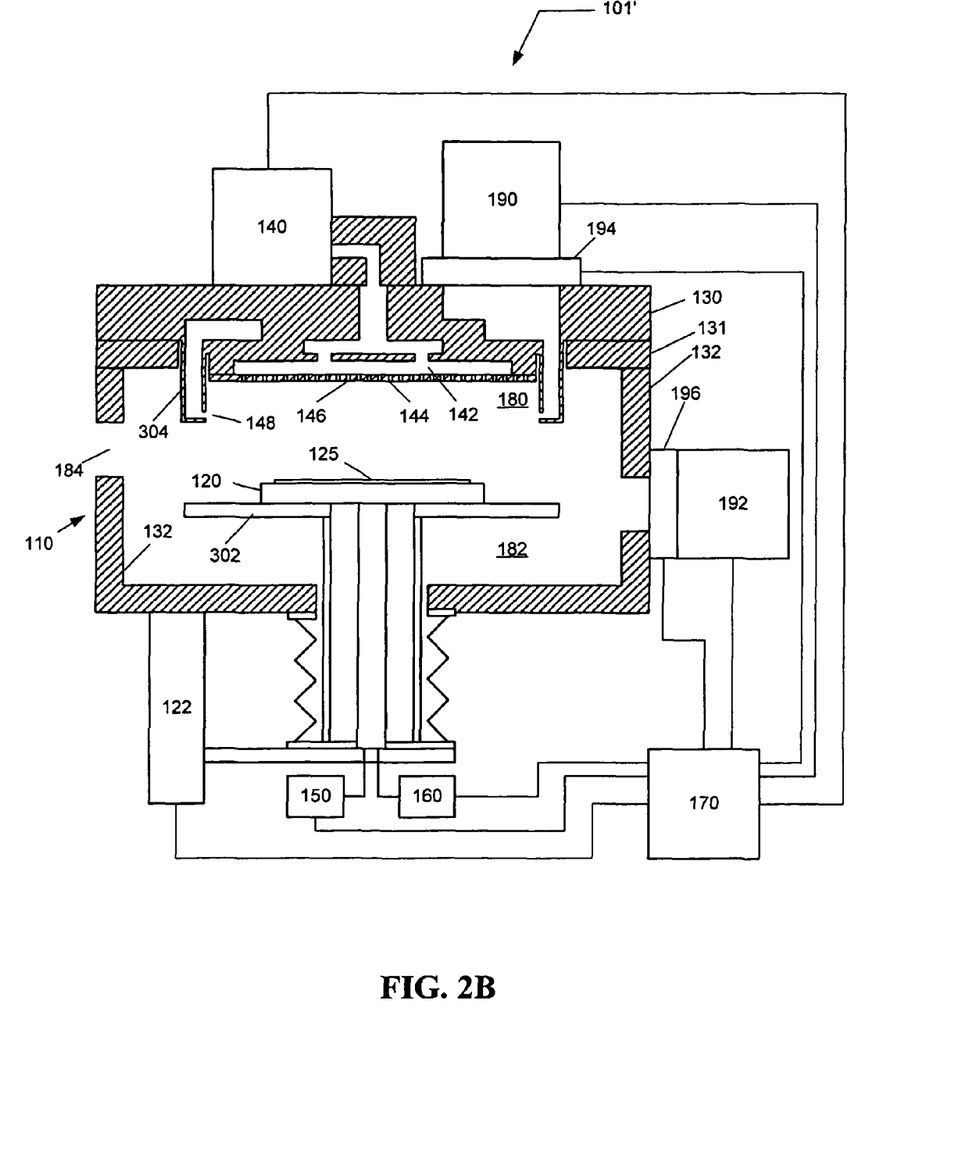

As shown in FIG. 1A, in one embodiment of the present invention, the deposition system 101 includes a processing chamber 110 having a substrate stage 120 configured to support a substrate 125, upon which a material deposit such as a thin film is formed. The processing chamber 110 further includes an upper chamber assembly 130 configured to define a process space 180 when coupled with substrate stage 120, and a lower chamber assembly 132 configured to define a transfer space 182. Optionally, as shown in FIG. 1B, an intermediate section 131 (i.e., a mid-chamber assembly) can be used in deposition system 101' to connect the upper chamber assembly 130 to the lower chamber assembly 132. Additionally, the deposition system 101 includes a process material supply system 140 configured to introduce a first process material, a second process material, or a purge gas to processing chamber 110. Additionally, the deposition system 101 includes a first power source 150 coupled to the processing chamber 110 and configured to generate plasma in the processing chamber 110, and a substrate temperature control system 160 coupled to substrate stage 120 and configured to elevate and control the temperature of substrate 125. Additionally, the deposition system 101 includes a process volume adjustment system 122 coupled to the processing chamber 110 and the substrate holder 120, and configured to adjust the volume of the process space 180 adjacent substrate 125. For example, the process volume adjustment system 180 can be configured to vertically translate the substrate holder 120 between a first position for processing substrate 125 (see FIGS. 1A and 1B) and a second position for transferring substrate 125 into and out of processing chamber 110 (see FIGS. 2A and 2B).

Furthermore, the deposition system 101 includes a first vacuum pump 190 coupled to process space 180, wherein a first vacuum valve 194 is utilized to control the pressure within process space 180. The deposition system 101 includes a second vacuum pump 192 coupled to transfer space 182, wherein a second vacuum valve 196 is utilized to isolate the second vacuum pump 192 from transfer space 182, when necessary.

Further yet, deposition system 101 includes a controller 170 that can be coupled to processing chamber 110, substrate holder 120, upper assembly 130, lower assembly 132, process material supply system 140, first power source 150, substrate temperature control system 160, process volume adjustment system 122, first vacuum pump 190, first vacuum valve 194, second vacuum pump 192, and second vacuum valve 196.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 110, and may be lifted to and from an upper surface of substrate holder 120 via substrate lift system (not shown).

The process material supply system 140 can include a first process material supply system and a second process material supply system which are configured to alternatingly introduce a first process material to processing chamber 110 and a second process material to processing chamber 110. The alternation of the introduction of the first process material and the introduction of the second process material can be cyclical, or it may be acyclical with variable time periods between introduction of the first and second process materials. The first process material can, for example, include a film precursor, such as a composition having the principal atomic or molecular species found in the film formed on substrate 125. For instance, the film precursor can originate as a solid phase, a liquid phase, or a gaseous phase, and may be delivered to processing space 180 in a gaseous phase. The second process material can, for example, include a reducing agent. For instance, the reducing agent can originate as a solid phase, a liquid phase, or a gaseous phase, and it may be delivered to processing chamber 110 in a gaseous phase. Examples of gaseous film precursors and reduction gases are given below.

Additionally, the process material supply system 140 can further include a purge gas supply system that can be configured to introduce a purge gas to processing chamber 110 between introduction of the first process material and the second process material to processing chamber 110, respectively. The purge gas can include an inert gas, such as a noble gas (i.e., helium, neon, argon, xenon, krypton), or nitrogen (and nitrogen containing gases), or hydrogen (and hydrogen containing gases).

The process gas supply system 140 can include one or more material sources, one or more pressure control devices, one or more flow control devices, one or more filters, one or more valves, or one or more flow sensors (not shown). The process gas supply system 140 can supply one or more process gases to plenum 142, through which gases are dispersed to a plurality of orifices 146 in injection plate 144. The plurality of orifices 146 in injection plate 144 facilitates the distribution of process gases within process space 180. A showerhead design, as known in the art, can be used to uniformly distribute the first and second process gas materials into the process space 180. Exemplary showerheads are described in greater detail in pending U.S. Patent Application Pub. No. 20040123803, the entire contents of which is incorporated herein by reference in its entirety, and in previously incorporated by reference U.S. Ser. No. 11/090,255.

Referring back to FIG. 1A, deposition system 101 can be configured to perform a thermal deposition process (i.e., a deposition process not utilizing a plasma), such as a thermal atomic layer deposition (ALD) process or a thermal chemical vapor deposition (CVD) process. Alternatively, deposition system 101 can be configured for a plasma enhanced deposition process in which either of the first process material or the second process material can be plasma activated. The plasma enhanced deposition process can include a plasma enhanced ALD (PEALD) process, or it may include a plasma enhanced CVD (PECVD) process.

In a PEALD process, a first process material, such as a film precursor, and a second process material, such as a reduction gas, are sequentially and alternatingly introduced to form a thin film on a substrate. For example, when preparing a tantalum-containing film using a PEALD process, the film precursor can comprise a metal halide (e.g., tantalum pentachloride), or a metal organic (e.g., $Ta(NC(CH_3)_2C_2H_5)(N(CH_3)_2)_3$; hereinafter referred to as TAIMATA®; for additional details, see U.S. Pat. No. 6,593,484). In this example, the reduction gas can include hydrogen, ammonia ($NH_3$), $N_2$ and $H_2$, $N_2H_4$, $NH(CH_3)_2$, or $N_2H_3CH_3$, or any combination thereof.

The film precursor is introduced to processing chamber 110 for a first period of time in order to cause adsorption of the film precursor on exposed surfaces of substrate 125. Preferably, a monolayer adsorption of material occurs. Thereafter, the processing chamber 110 is purged with a purge gas for a second period of time. After adsorbing film precursor on substrate 125, a reduction gas is introduced to processing chamber 110 for a third period of time, while power is coupled through, for example, the upper assembly 130 from the first power source 150 to the reduction gas. The coupling of power to the reduction gas heats the reduction gas, thus causing ionization and dissociation of the reducing gas in order to form, for example, dissociated species such as atomic hydrogen which can react with the adsorbed Ta film precursor to reduce the adsorbed Ta film precursor to form the desired Ta containing film. This cycle can be repeated until a Ta containing layer of sufficient thickness is produced.

Further, the second process material can be introduced concurrent with or immediately about the time in which the process space 180 is increased in volume from V1 to V2. Power can be coupled through the substrate stage 120 from the first power source 150 to the second process material. The coupling of power to the second process material heats the second process material, thus causing ionization and dissociation of the second process material (i.e., plasma formation) in order to reduce the adsorbed constituents of the first process material. The processing chamber can be purged with a purge gas for another period of time. The introduction of the first process gas material, the introduction of the second process material, and the formation of the plasma while the second process material is present can be repeated any number of times to produce a film of desired thickness.

Moreover, first volume (V1) can be sufficiently small such that the first process gas material passes through the process space and some fraction of the first process material adsorbs on the surface of the substrate. As the first volume of the process space is reduced, the amount of the first process material necessary for adsorption on the substrate surface is reduced and the time required to exchange the first process material within the first process space is reduced. For instance, as the first volume of the process space is reduced, the residence time is reduced, hence, permitting a reduction in the first period of time.

As shown in FIG. 1, the process space 180 is separated from the transfer space 182 by the substrate stage 120, a flange 302 on the substrate stage 120, and an extension 304 from the upper chamber assembly 130. As such, there can be a sealing mechanism at the base of the extension 304 to seal or at least impede gas flow between the process space and the transfer space (to be discussed in detail later). Thus, surfaces of the process space 180 can be maintained at an elevated temperature to prevent accumulation of process residues on surfaces surrounding that space, while surfaces of the transfer space can be maintained at a reduced temperature to reduce contamination of the lower assembly 132 (including sidewalls) and the intermediate section 131 and the upper assembly 132.

In this regard, separation of the process space from the transfer space, in one embodiment of the present invention, involves thermal separation of the elevated upper chamber assembly 130 from the reduced temperature lower chamber assembly 132. For thermal separation, the extension 304 can function as a radiation shield. Moreover, the extension 304 including an interior channel 312 can function as a thermal impedance limiting the heat flow across the extension element into the transfer space 182 surrounding the extension 304.

In another example of thermal separation, a cooling channel can be provided in the upper chamber assembly 130 near the lower chamber assembly 132 as shown in FIG. 1A, or near the intermediate section 131 as shown in FIG. 1B, or can be provided in the intermediate section 131. Further, the thermal conductivity of the materials for the upper chamber assembly 130 and the intermediate section 131 can be different. For example, the upper chamber assembly 130 can be made of aluminum or an aluminum alloy, and the intermediate section 131 can be made of stainless steel. The lower chamber assembly 132 can be made of aluminum or an aluminum alloy.

In one example, a vapor deposition process can be used be to deposit tantalum (Ta), tantalum carbide, tantalum nitride, or tantalum carbonitride in which a Ta film precursor such as $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, adsorbs to the surface of the substrate followed by exposure to a reduction gas or plasma such as $H_2$, $NH_3$, $N_2$ and $H_2$, $N_2H_4$, $NH(CH_3)_2$, or $N_2H_3CH_3$.

In another example, titanium (Ti), titanium nitride, or titanium carbonitride can be deposited using a Ti precursor such as $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and a reduction gas or plasma including $H_2$, $NH_3$, $N_2$ and $H_2$, $N_2H_4$, $NH(CH_3)_2$, or $N_2H_3CH_3$.

As another example, tungsten (W), tungsten nitride, or tungsten carbonitride can be deposited using a W precursor such as $WF_6$, or $W(CO)_6$, and a reduction gas or plasma including $H_2$, $NH_3$, $N_2$ and $H_2$, $N_2H_4$, $NH(CH_3)_2$, or $N_2H_3CH_3$.

In another example, molybdenum (Mo) can be deposited using a Mo precursor such as molybdenum hexafluoride ($MoF_6$), and a reduction gas or plasma including $H_2$.

In another example, Cu can be deposited using a Cu precursor having Cu-containing organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The reduction gas or plasma can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example of a vapor deposition process, when depositing zirconium oxide, the Zr precursor can include $Zr(NO_3)_4$, or $ZrCl_4$, and the reduction gas can include $H_2O$.

When depositing hafnium oxide, the Hf precursor can include $Hf(OBu^t)_4$, $Hf(NO_3)_4$, or $HfCl_4$, and the reduction gas can include $H_2O$. In another example, when depositing hafnium (Hf), the Hf precursor can include $HfCl_4$, and the second process material can include $H_2$.

When depositing niobium (Nb), the Nb precursor can include niobium pentachloride ($NbCl_5$), and the reduction gas can include $H_2$.

When depositing zinc (Zn), the Zn precursor can include zinc dichloride ($ZnCl_2$), and the reduction gas can include $H_2$.

When depositing silicon oxide, the Si precursor can include $Si(OC_2H_5)_4$, $SiH_2Cl_2$, $SiCl_4$, or $Si(NO_3)_4$, and the reduction gas can include $H_2O$ or $O_2$. In another example, when depositing silicon nitride, the Si precursor can include $SiCl_4$, or $SiH_2Cl_2$, and the reduction gas can include $NH_3$, or $N_2$ and $H_2$. In another example, when depositing TiN, the Ti precursor can include titanium nitrate ($Ti(NO_3)$), and the reduction gas can include $NH_3$.

In another example of a vapor deposition process, when depositing aluminum, the Al precursor can include aluminum chloride ($Al_2Cl_6$), or trimethylaluminum ($Al(CH_3)_3$), and the reduction gas can include $H_2$. When depositing aluminum nitride, the Al precursor can include aluminum trichloride, or trimethylaluminum, and the reduction gas can include $NH_3$, or $N_2$ and $H_2$. In another example, when depositing aluminum oxide, the Al precursor can include aluminum chloride, or trimethylaluminum, and the reduction gas can include $H_2O$, or $O_2$ and $H_2$.

In another example of a vapor deposition process, when depositing GaN, the Ga precursor can include gallium nitrate ($Ga(NO_3)_3$), or trimethylgallium ($Ga(CH_3)_3$), and the reduction gas can include $NH_3$.

In the examples given above for forming various material layers, the process material deposited can include at least one of a metal film, a metal nitride film, a metal carbonitride film, a metal oxide film, or a metal silicate film. For example, the process material deposited can include at least one of a tantalum film, a tantalum nitride film, or a tantalum carbonitride film. Alternatively, for example, the process material deposited can include for example an Al film, or a Cu film deposited to metallize a via for connecting one metal line to another metal line or for connecting a metal line to source/drain contacts of a semiconductor device. The Al or Cu films can be formed with or without a plasma process using precursors for the Al and Cu as described above. Alternatively, for example, the process material deposited can include a zirconium oxide film, a hafnium oxide film, a hafnium silicate film, a silicon oxide film, a silicon nitride film, a titanium nitride film, and/or a GaN film deposited to form an insulating layer such as for example above for a metal line or a gate structure of a semiconductor device.

Further, silane and disilane could be used as silicon precursors for the deposition of silicon-based or silicon-including films. Germane could be used a germanium precursor for the deposition of germanium-based or germanium-including films. As such, the process material deposited can include a metal silicide film and/or a germanium-including film deposited for example to form a conductive gate structure for a semiconductor device.

Referring still to FIG. 1A, the deposition system 101 includes a plasma generation system configured to generate a plasma during at least a portion of the alternating introduction of the first process material and the second process material to processing chamber 110. The plasma generation system can include the first power source 150 coupled to the processing chamber 110, and configured to couple power to the first process material, or the second process material, or both in processing chamber 110. The first power source 150 may include a radio frequency (RF) generator and an impedance match network (not shown), and may further include an electrode (not shown) through which RF power is coupled to plasma in processing chamber 110. The electrode can be formed in the substrate stage 120, or may be formed in the upper assembly 130 and can be configured to oppose the substrate stage 120. The substrate stage 120 can be electrically biased with a DC voltage or at an RF voltage via the transmission of RF power from an RF generator (not shown) through an impedance match network (not shown) to substrate stage 120.

The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 110 by reducing the reflected power. Match network topologies (e.g. L-type, π-type, T-type, etc.) and automatic control methods are well known to those skilled in the art. A typical frequency for the RF power can range from about 0.1 MHz to about 100 MHz. Alternatively, the RF frequency can, for example, range from approximately 400 kHz to approximately 60 MHz, By way of further example, the RF frequency can, for example, be approximately 13.56 or 27.12 MHz.

Still referring to FIG. 1A, deposition system 101 includes substrate temperature control system 160 coupled to the substrate stage 120 and configured to elevate and control the temperature of substrate 125. Substrate temperature control system 160 includes temperature control elements, such as a cooling system including a re-circulating coolant flow that receives heat from substrate stage 120 and transfers heat to a heat exchanger system (not shown), or when heating, transfers heat from the heat exchanger system. Additionally, the temperature control elements can include heating/cooling elements, such as resistive heating elements, or thermoelectric heaters/coolers can be included in the substrate holder 120, as well as the chamber wall of the processing chamber 110 and any other component within the deposition system 101.

In order to improve the thermal transfer between substrate 125 and substrate stage 120, substrate stage 120 can include a mechanical clamping system, or an electrical clamping system, such as an electrostatic clamping system, to affix substrate 125 to an upper surface of substrate stage 120. Furthermore, substrate holder 120 can further include a substrate backside gas delivery system configured to introduce gas to the backside of substrate 125 in order to improve the gas-gap thermal conductance between substrate 125 and substrate stage 120. Such a system can be utilized when temperature control of the substrate is required at elevated or reduced temperatures. For example, the substrate backside gas system can include a two-zone gas distribution system, wherein the helium gas gap pressure can be independently varied between the center and the edge of substrate 125.

Furthermore, the processing chamber 110 is further coupled to the first vacuum pump 190 and the second vacuum pump 192. The first vacuum pump 190 can include a turbomolecular pump, and the second vacuum pump 192 can include a cryogenic pump.

The first vacuum pump 190 can include a turbo-molecular vacuum pump (TMP) capable of a pumping speed up to about 5000 liters per second (and greater) and valve 194 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

As shown in FIGS. 1A, 1B, 2A and 2B, the first vacuum pump 190 can be coupled to process space 180 such that it is located above the plane of substrate 125. However, the first vacuum pump 190 can be configured to access process space 180 such that it pumps process space 180 from a location below the plane of substrate 125 in order to, for example, reduce particle contamination. The fluid coupling between the location of pumping from process space 180 and the inlet to the first vacuum pump 190 can be designed for maximal flow conductance. Alternately, the fluid coupling between the location of pumping from process space 180 and the inlet to the first vacuum pump 190 can be designed for a substantially constant cross-sectional area.

In one embodiment, the first vacuum pump 190 is located above the upper chamber assembly 130 and is coupled to an upper surface thereof (see FIG. 1A). The inlet 191 of the first vacuum pump 190 is coupled to at least one annular volume, such as a pumping channel 312, which is coupled through extension 304 to one or more openings 305 that access process space 180 at a location below the plane of substrate 125. The one or more openings 305 may comprise one or more slots, one or more orifices, or any combination thereof.

In another embodiment, the first vacuum pump 190 is located above the upper chamber assembly 130 and is coupled to an upper surface thereof (see FIG. 1A). The inlet 191 of the first vacuum pump 190 is coupled to a first annular volume that is in turn coupled to a second annular volume, whereby the first annular volume and the second annular volume are coupled via one or more pumping ports. The second annular volume can be coupled to pumping channel 312, which is coupled through extension 304 to one or more openings 305 that access process space 180 at a location below the plane of substrate 125. For example, the one or more pumping ports may comprise two through-holes diametrically opposing one another (i.e., 180 degrees apart) between the first annular volume and the second annular volume. However, the number of pumping ports may be more or less, and their location may vary. Additionally, for example, the one or more openings 305 may comprise two slots diametrically opposing one another (i.e., 180 degrees apart). Furthermore, each slot can extend approximately 120 degrees in the azimuthal direction. However, the number of openings 305 may be more or less, and their location and size may vary.

As noted above, it is desirable to be able to adjust the volume of process space 180 without losing a seal between the upper chamber assembly 130 and the lower chamber assembly 132.

Techniques for sealing (and movably sealing) the substrate stage 120 with the upper chamber assembly 130 when the deposition system 101 is in a processing configuration are taught in a co-pending application entitled "APPARATUS FOR THERMAL AND PLASMA ENHANCED VAPOR DEPOSITION AND METHOD OF OPERATING", which is incorporated herein in its entirety. As such, the system includes a sealing member that impedes the flow of gas between the process space and the transfer space. Indeed, in one embodiment, a seal of the sealing member separates the vacuum environment of the process space from the vacuum environment of the transfer space. By vacuum separating the process space from the transfer space, the seal is able to reduce leakage between the process space and the transfer space to less than $10^{-3}$ Torr-l/s and preferably less than $10^{-4}$ Torr-l/s.

In some configurations, for example, the second volume (V2) of the process space 180 can be set to a volume in which the formation of plasma from the second process material leads to the formation of uniform plasma above the substrate, without loss of seal between the process space 180 and the vacuum in the lower assembly 132

In one embodiment of the present invention, the need to have the upper chamber assembly 130 at an elevated temperature is coupled with the need to have the lower chamber assembly (i.e., the transfer section) at as a low a temperature as practical in order to minimize out gassing and degradation of the vacuum integrity. This concern is particularly acute when the lower chamber assembly 132 is an ultra-high vacuums compartment. Theoretically, a seal between these regions should accommodate the thermal expansion differences between the upper and lower chamber assemblies while preventing leakage of the outside ambient into the vacuum in the deposition system 101.

The present inventor has discovered, however that traditional O-ring configurations for sealing between an elevated temperature section and a lower temperature section are susceptible to increased gas permeation from the outside ambient.

To address this concern, the present invention in one embodiment provides for a novel seal configuration. As such, gas permeation from the outside ambient is prevented (or reduced to acceptably low levels) while disassembly of the upper chamber assembly 130 from the deposition system 101 is facilitated by a sealing configuration that uses a flexible sealing member.

Figure 3A:
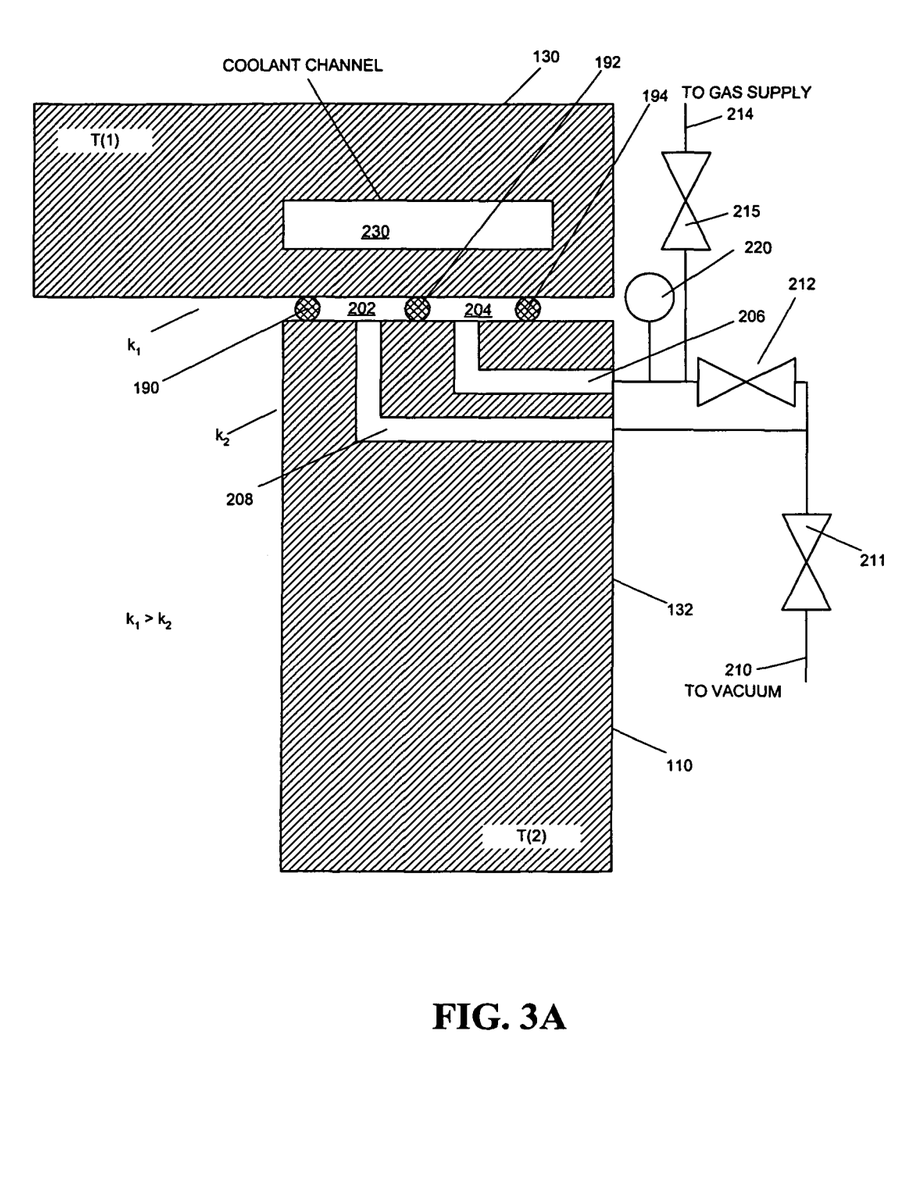
FIG. 3A depicts a schematic view of a first sealing mechanism in accordance with one embodiment of the invention.

FIG. 3A is a schematic illustrating a first novel seal configuration sealing between the upper chamber assembly 130 and the lower chamber assembly 132. As shown in FIG. 3A, in one embodiment of the present invention, at least two sealed compartments are utilized to separate the vacuum side of the deposition system 101 from the outside ambient. As shown in FIG. 3A, three seals 190, 192, and 194 can be used to isolate the two compartments 202 and 204. Of the two compartments, compartment 202 forms an innermost compartment, and compartment 204 forms an outermost compartment. Additional outer compartments could be used in the present invention. As shown in FIG. 3A, separate channels 206 and 208 connect to the compartments 202 and 204. The interior compartment 202 is connected to a vacuum 210, separate from the vacuum inside the deposition system 101, through channel 206. The outer compartment 204 is connected to the vacuum 210 through channel 208 and through an isolation valve 212. Additionally, as shown in FIG. 3A, channel 208 is connected to a gas supply 214. Gas supply 214 is preferably a supply of a high purity gas such as He, or Ar. Vacuum 210 and gas supply 214 can be isolated respectively by valves 211 and 215. The pressure of the high purity gas developed in compartment 204 (or compartment 202 under a purge evacuation cycle) is measured by a pressure sensing device 220 such as a capacitance manometer or pressure switch. When a desired pressure (e.g., 100-10,000 Torr) is reached, the supply of high purity gas is closed.

In one aspect of the present invention, the air ambient in compartments 202 and 204 can be evacuated and replaced by the high purity gas. Any permeation through the seals 190 and 192 will thus not leak air ambient but rather will leak high purity gas into the vacuum of the deposition system 101. Furthermore, by utilizing a pressure in compartment 204 above atmospheric pressure (e.g., greater than 760 Torr), any permeation through seal 194 will leak the high purity gas outwards into the atmosphere.

The deposition system configuration shown in FIG. 3A utilizes for example an elevated temperature (T1) upper chamber assembly 130 (i.e., a first assembly) and a reduced temperature (T2) lower chamber assembly 132 (i.e., a second assembly). Maintenance of the elevated temperature first assembly and the reduced temperature second assembly can be obtained, in one embodiment of the present invention, by a coolant channel 230 and/or by the use of materials of different thermal conductivities K1 and K2 respectively as shown in FIG. 3A. The seals 190, 192, and 194 seal between the upper chamber section 130 and the lower chamber section 132. Further, in different embodiments of the present invention, the coolant channel 230 can be included in the upper chamber assembly 130 proximate the seals. Further, in one embodiment of the present invention, the coolant channel 230 and/or the channels 206 and 208 can be included in a body of the lower chamber assembly 132, without the need to have a mid-chamber section 131.

Figure 3B:
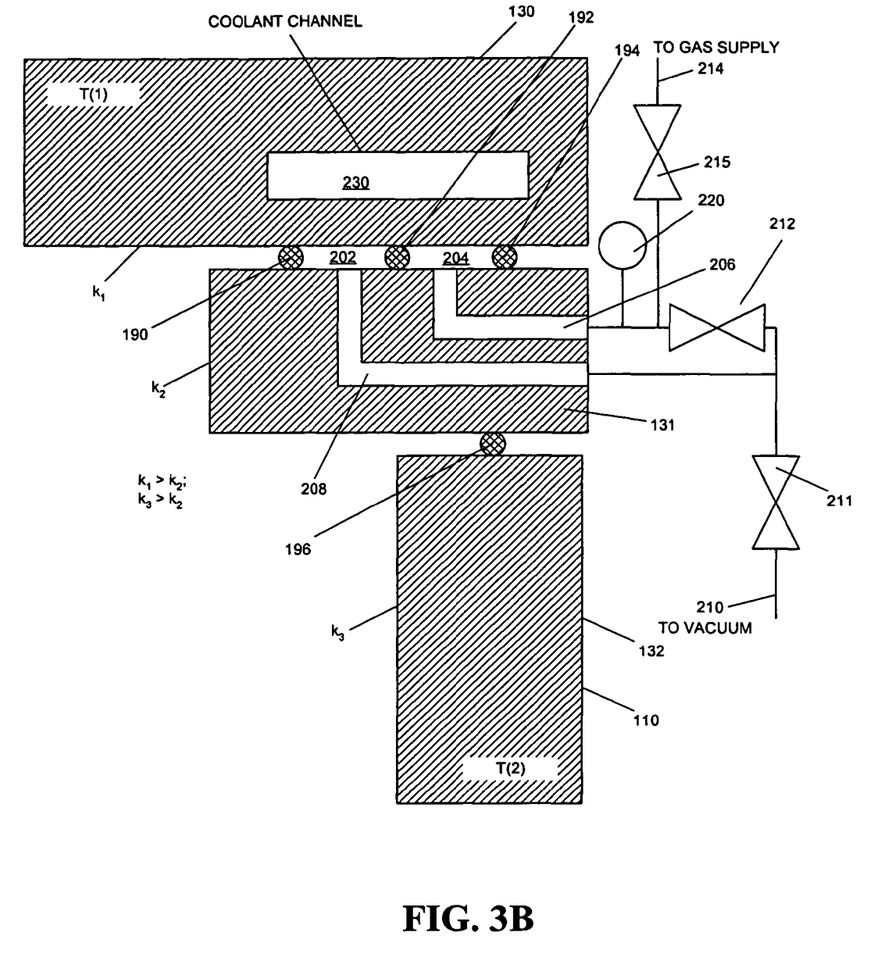
FIG. 3B depicts a schematic view of another sealing mechanism in accordance with one embodiment of the present invention.

FIG. 3B is a schematic illustrating a second novel seal configuration sealing between the upper chamber assembly 130 and the lower chamber assembly 132. As shown in FIG. 3B, in one embodiment of the present invention, at least two sealed compartments are utilized to separate the vacuum side of the deposition system 101 from the outside ambient. As shown in FIG. 3B, three seals 190, 192, and 194 can be used to isolate the two compartments 202 and 204. Of the two compartments, compartment 202 forms an innermost compartment, and compartment 204 forms an outermost compartment. Additional outer compartments could be used in the present invention. As shown in FIG. 3B, separate channels 206 and 208 connect to the compartments 202 and 204. The interior compartment 202 is connected to a vacuum 210, separate from the vacuum inside the deposition system 101, through channel 206. The outer compartment 204 is connected to the vacuum 210 through channel 208 and through an isolation valve 212. Additionally, as shown in FIG. 3B, channel 208 is connected to a gas supply 214. Gas supply 214 is preferably a supply of a high purity gas such as He, or Ar. Vacuum 210 and gas supply 214 can be isolated respectively by valves 211 and 215. The pressure of the high purity gas developed in compartment 204 (or compartment 202 under a purge evacuation cycle) is measured by a pressure sensing device 220 such as a capacitance manometer or pressure switch. When a desired pressure (e.g., 100-10,000 Torr) is reached, the supply of high purity gas is closed.

In one aspect of the present invention, the air ambient in compartments 202 and 204 can be evacuated and replaced by the high purity gas. Any permeation through the seals 190 and 192 will thus not leak air ambient but rather will leak high purity gas into the vacuum of the deposition system 101. Furthermore, by utilizing a pressure in compartment 204 above atmospheric pressure (e.g., greater than 760 Torr), any permeation through seal 194 will leak the high purity gas outwards into the atmosphere.

As depicted in FIG. 3B, the sealing configuration can include a lower seal 196. The deposition system configuration shown in FIG. 3B utilizes for example an elevated temperature (T1) upper chamber assembly 130 (i.e., a first assembly) and a reduced temperature (T2) lower chamber assembly 132 (i.e., a second assembly). Maintenance of the elevated temperature first assembly and the reduced temperature second assembly can be obtained, in one embodiment of the present invention, by a coolant channel 230 and/or by the use of materials of different thermal conductivities K1, K2, and K3 respectively as shown in FIG. 3B. The seals 190, 192, and 194 seal between the upper chamber section 130 and a mid-chamber section 131. The seal 196 seals between the mid-chamber section 131 and the lower chamber section 132. A single seal can be used for seal 196 as seal 196 is not at an elevated temperature. Further, in different embodiments of the present invention, the coolant channel 230 can be included in the upper chamber assembly 130 proximate the seals or can be included in the mid-chamber section 131. Further, in one embodiment of the present invention, the coolant channel 230 and/or the channels 206 and 208 can be included in a body of the lower chamber assembly 132, without the need to have a mid-chamber section 131.

Figure 4:
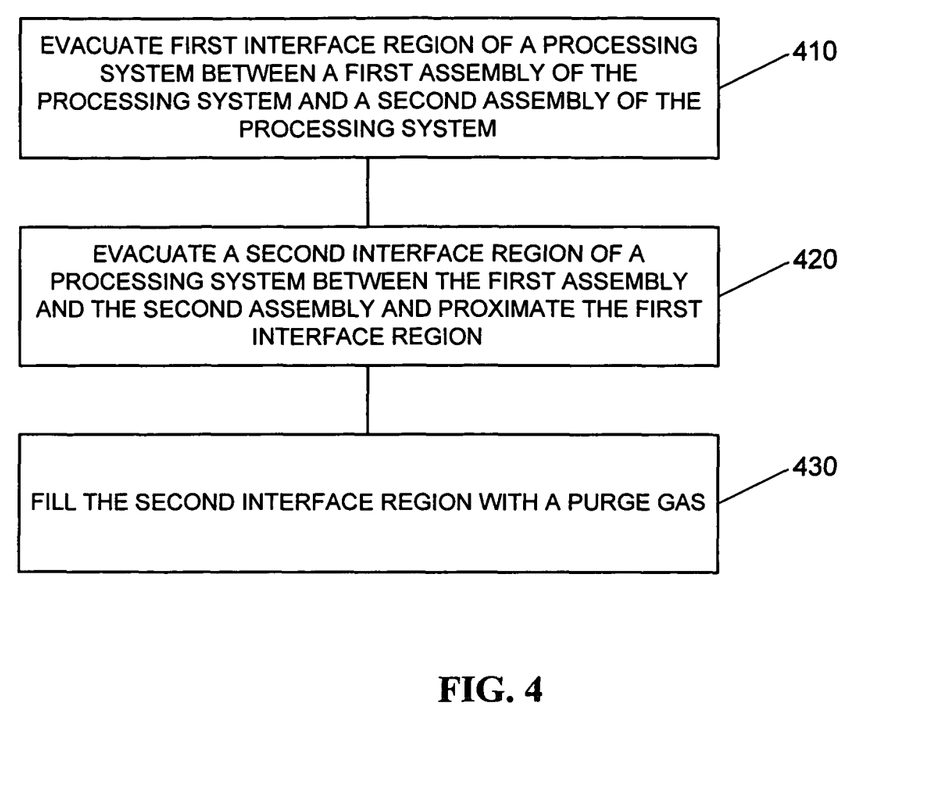
FIG. 4 shows a process flow diagram of a process in accordance with one embodiment of the present invention.

FIG. 4 shows a process flow diagram of a process in accordance with one embodiment of the present invention. The process of FIG. 4 may be performed by the processing system of FIGS. 1-2, or any other suitable processing system. As seen in FIG. 4, in step 410, the process includes disposing a substrate in a process space of a processing system that is vacuum isolated from a transfer space of the processing system. In step 420, a substrate is processed at either of a first position or a second position in the process space while maintaining vacuum isolation from the transfer space. In step 830, a material is deposited on the substrate at either the first position or the second position.

FIG. 4 depicts a process flow diagram of a process in accordance with one embodiment of the present invention for sealing a first assembly of a processing system to a second assembly of the processing system. The process of FIG. 4 may be performed by the processing systems shown herein, or any other suitable processing system. In step 410, the process begins by evacuating a first interface region (e.g., compartment 202) proximate an interior of the processing system and located between the first assembly and the second assembly. As described above, first interface region (e.g., compartment 202) and an interior of the vacuum processing system can be separated by a first seal (e.g., seal 190). In step 420, a second interface region (e.g., compartment 204) proximate the first interface region and located between the first assembly and the second assembly is evacuated. As seen in FIGS. 3A and 3B, the second interface region (e.g., compartment 204) and the exterior of the vacuum processing system can be separated by a second seal (e.g., seal 194), and the first interface region (e.g., compartment 202) and the second interface region (e.g., compartment 204) can be separated by a third seal (e.g., seal 192). In step 430, the second interface region is filled with a purge gas.

In steps 410-430, the first assembly can be maintained at an elevated temperature, and the second assembly can be maintained at a lower temperature than the elevated temperature. In steps 410-430, a part of the first assembly proximate the first interface region and/or proximate the second interface region can be cooled. In steps 410-430, a part of the first assembly can be maintained greater than or equal to 100 degrees C., and a part of the second assembly can be maintained less than 100 degrees C. In steps 410-430, a part of the first assembly can be maintained greater than or equal to 50 degrees C., and a part of the second assembly can be maintained less than 50 degrees C.

Prior to step 410, the first interface region can be filled with a gas containing less than 0.01% of oxygen and water vapor; and then evacuated. The first interface region can be filled with a gas containing less than 1 ppm of oxygen and water vapor such as for example high purity He or Ar. The first interface region can be filled to a pressure of 100-10,000 Torr with a gas containing less than 0.1 ppm of oxygen and water vapor, and then evacuated.

In step 420, the second interface region can be filled with a gas containing less than 1 ppm of oxygen and water vapor such as for example high purity He, or Ar. The second interface region can be filled to a pressure of 100-10,000 Torr with a gas containing less than 1 ppm of oxygen and water vapor Still referring to FIGS. 1 and 2, controller 170 can include a microprocessor, memory, and a digital I/O port capable of generating control voltages sufficient to communicate and activate inputs to deposition system 101 as well as monitor outputs from deposition system 101. Moreover, the controller 170 may exchange information with the processing chamber 110, substrate stage 120, upper assembly 130, lower chamber assembly 132, process material supply system 140, first power source 150, substrate temperature control system 160, first vacuum pump 190, first vacuum valve 194, second vacuum pump 192, second vacuum valve 196, and process volume adjustment system 122. For example, a program stored in the memory may be utilized to activate the inputs to the aforementioned components of the deposition system 101 according to a process recipe in order to perform an etching process, or a deposition process.

The controller 170 can include a microprocessor, memory, and a digital I/O port capable of generating control voltages sufficient to communicate and activate inputs to deposition system 101 (101') as well as monitor outputs from deposition system 101 (101') in order to control and monitor the above-discussed processes for material deposition. For example, the controller 170 can include computer readable medium containing program instructions for execution to accomplish the steps described above in relation to FIG. 6. Moreover, the controller 170 may be coupled to and may exchange information with the process chamber 110, substrate stage 120, upper assembly 130, process material gas supply system 140, power source 150, substrate temperature controller 160, first vacuum pumping system 190, and/or second vacuum pumping system 192. For example, a program stored in the memory may be utilized to activate the inputs to the aforementioned components of the deposition system 101 (101') according to a process recipe in order to perform one of the above-described non-plasma or plasma enhanced deposition processes.

One example of the controller 170 is a DELL PRECISION WORKSTATION 610™, available from Dell Corporation, Austin, Tex. However, the controller 170 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 170 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 170, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 170 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 170.

The controller 170 may be locally located relative to the deposition system 101 (101'), or it may be remotely located relative to the deposition system 101. For example, the controller 170 may exchange data with the deposition system 101 using at least one of a direct connection, an intranet, the Internet and a wireless connection. The controller 170 may be coupled to an intranet at, for example, a customer site (i.e., a device maker, etc.), or it may be coupled to an intranet at, for example, a vendor site (i.e., an equipment manufacturer). Additionally, for example, the controller 170 may be coupled to the Internet. Furthermore, another computer (i.e., controller, server, etc.) may access, for example, the controller 170 to exchange data via at least one of a direct connection, an intranet, and the Internet. As also would be appreciated by those skilled in the art, the controller 170 may exchange data with the deposition system 101 (101') via a wireless connection.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A sealing device configured to provide a seal between a first assembly of a processing system and a second assembly of the processing system, comprising:
   a first seal located between the first assembly and the second assembly at a first location proximate an interior of the processing system;
   the first assembly including an elevated temperature part heated by a heat source, said first assembly maintainable at an elevated temperature relative to the second assembly and including a gas injection plate extending laterally with respect to a longitudinal axis of a substrate stage moveable within the processing system;
   a second seal located between the first assembly and the second assembly at a second location proximate the first location;
   a third seal located between the first assembly and the second assembly at a third location proximate the second location;
   a first channel in the second assembly, connecting a first interface region disposed between the first seal and the second seal, and configured to couple the first interface region to a vacuum source or a purge gas supply;
   a second channel in the second assembly, connecting a second interface region disposed between the second seal and the third seal, and configured to couple the second interface region to the vacuum source or the purge gas supply;
   said first and second channels extending downward from the first and second interface regions and thereafter extending outwardly to an outside of the second assembly;
   the first assembly comprising a metallic assembly including a cooling device in between 1) the first, second, and third seals and 2) a part of the metallic assembly conducting heat from the heat source toward the second assembly;
   said cooling device proximate the first, second, and third seals, having a width extending along a direction of the first, second, and third seals and extending over the first, second, and third seals and over the first and second interface regions between the first, second, and third seals, and configured to reduce a temperature of a region of the first assembly proximate the first seal, and
   said cooling device comprising a temperature control element configured to maintain the first assembly at said elevated temperature relative to the second assembly.

2. The sealing device of claim 1, wherein the first assembly is configured to be at an elevated temperature, and the second assembly is configured to be at a lower temperature than the elevated temperature.

3. The sealing device of claim 1, wherein the cooling device comprises:
a coolant channel inside a body of the first assembly proximate the first interface region.

4. The sealing device of claim 1, wherein the cooling device is coupled to the second assembly and is configured to reduce a temperature of a part of the second assembly proximate the first location.

5. The sealing device of claim 1, wherein:
the first assembly comprises a first conductivity material, and
the second assembly comprises a second conductivity material.

6. The sealing device of claim 5, wherein the first conductivity material has a thermal conductivity greater than the second conductivity material.

7. The sealing device of claim 1, further comprising:
a base of the processing system connected to the second assembly on a side of the second assembly opposite the first assembly,
said base comprised of a third conductivity material.

8. The sealing device of claim 7, wherein the second conductivity material has a lower thermal conductivity than the third conductivity material.

9. The sealing device of claim 7, wherein the base comprises an aluminum or aluminum alloy material.

10. The sealing device of claim 1, wherein the first assembly comprises an aluminum or aluminum alloy material.

11. The sealing device of claim 1, wherein the second assembly comprises a stainless steel material.

12. The sealing device of claim 1, wherein the purge gas supply comprises a purge gas containing less than 1 ppm of oxygen and water vapor.

13. The sealing device of claim 12, wherein the purge gas comprises at least one of He or Ar.

14. The sealing device of claim 1, wherein the purge gas supply comprises a purge gas containing less than 0.5 ppm of oxygen and water vapor.

15. The sealing device of claim 14, wherein the purge gas comprises at least one of He or Ar.

16. The sealing device of claim 1, wherein the first interface region is configured to be pressurized to a pressure of 100-10,000 Torr with a purge gas containing less than 1 ppm oxygen and water vapor.

17. The sealing device of claim 1, wherein the second interface region is configured to be pressurized to a pressure of 100-10,000 Torr with a purge gas containing less than 0.5 ppm of oxygen and water vapor.

18. The sealing device of claim 1, wherein at least one the first, second, and third seals comprises an elastomer.

19. The sealing device of claim 18, wherein the elastomer comprises at least one of viton, neoprene, butyl-rubber, silicone, nitrile, teflon, kalrez, or silicone-rubber.

20. The sealing device of claim 1, wherein at least one of the first, second, or third seals comprises a helical-spring seal.

21. The sealing device of claim 1, wherein:
the first assembly is configured to be maintained greater than or equal to 100 degrees C., and
the second assembly is configured to be maintained less than 100 degrees C.

22. The sealing device of claim 1, wherein:
the first assembly is configured to be maintained greater than or equal to 50 degrees C., and
the second assembly is configured to be maintained less than 50 degrees C.

23. The sealing device of claim 1, wherein the first assembly comprises a first section of the first assembly proximate the cooling device maintainable at a higher temperature than a second section of the second assembly proximate the cooling device.

24. A sealing device configured to provide a seal between a first assembly of a processing system and a second assembly of the processing system, comprising:
a first seal located between the first assembly and the second assembly at a first location proximate an interior of the processing system;
the first assembly including an elevated temperature part heated by a heat source, said first assembly maintainable at an elevated temperature relative to the second assembly;
a second seal located between the first assembly and the second assembly at a second location proximate the first location;
a third seal located between the first assembly and the second assembly at a third location proximate the second location;
a first channel in the second assembly, connecting a first interface region disposed between the first seal and the second seal, and configured to couple the first interface region to a vacuum source or a purge gas supply;
a second channel in the second assembly, connecting a second interface region disposed between the second seal and the third seal, and configured to couple the second interface region to the vacuum source or the purge gas supply;
said first and second channels extending downward from the first and second interface regions and thereafter extending outwardly to an outside of the second assembly;
the first assembly comprising a metallic assembly including a cooling device in between 1) the first, second, and third seals and 2) a part of the metallic assembly conducting heat from the heat source toward the second assembly;
said cooling device proximate the first, second, and third seals and extending over the first, second, and third seals and over the first and second interface regions between the first, second, and third seals, and configured to reduce a temperature of a region of the first assembly proximate the first seal, and
said cooling device comprising a temperature control element configured to maintain the first assembly at said elevated temperature relative to the second assembly.

25. The sealing device of claim 1, further comprising:
a base of the processing system connected to the second assembly on a side of the second assembly opposite the first assembly, wherein
the first assembly comprises a first conductivity material comprising an aluminum or aluminum alloy material having a thermal conductivity k1,
the second assembly comprises a second conductivity material having a thermal conductivity k2,
the base comprises a third conductivity material comprising an aluminum or aluminum alloy material having a thermal conductivity k3,
k1 is greater than k2,
k3 is greater than k2, and
said first assembly is maintainable at an elevated temperature relative to the second assembly in part by the relative thermal conductivities k1, k2, and k3.

26. The sealing device of claim 24, wherein the first assembly comprises a first section of the first assembly proximate the cooling device maintainable at a higher temperature than a second section of the second assembly proximate the cooling device.

\* \* \* \* \*